United States Patent
Ohuchi (12)

(10) Patent No.: US 6,348,405 B1
(45) Date of Patent: Feb. 19, 2002

(54) INTERCONNECTION FORMING METHOD UTILIZING AN INORGANIC ANTIREFLECTION LAYER

(75) Inventor: Masahiko Ohuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/490,907

(22) Filed: Jan. 25, 2000

(30) Foreign Application Priority Data

Jan. 25, 1999 (JP) ............................................. 11-015099

(51) Int. Cl.⁷ ............................................. H01L 21/473
(52) U.S. Cl. ....................... 438/636; 438/637; 438/648
(58) Field of Search ................................. 438/636, 637, 438/642, 643, 648

(56) References Cited

U.S. PATENT DOCUMENTS

| | | |
|---|---|---|
| 5,441,914 A | 8/1995 | Taft et al. |
| 5,674,356 A | 10/1997 | Nagayama |
| 5,834,125 A | 11/1998 | Lien |
| 5,883,011 A | 3/1999 | Lin et al. |
| 6,013,582 A | * 1/2000 | Ionov et al. |
| 6,093,973 A | * 7/2000 | Ngo et al. |
| 6,103,456 A | * 8/2000 | Tobben et al. |
| 6,117,345 A | * 9/2000 | Liu et al. |
| 6,174,800 B1 | * 1/2001 | Jang |
| 6,177,353 B1 | * 1/2001 | Gutsche et al. |

FOREIGN PATENT DOCUMENTS

| | | |
|---|---|---|
| EP | 0 840 361 A2 | 5/1998 |
| JP | 7-201859 | 8/1995 |
| JP | 8-162460 | 6/1996 |
| JP | 9-055351 | 2/1997 |
| JP | 9-115875 | 5/1997 |
| JP | 9-321026 | 12/1997 |
| JP | 10-247652 | 9/1998 |

* cited by examiner

*Primary Examiner*—Charles Bowers
*Assistant Examiner*—Stephen W. Smoot
(74) *Attorney, Agent, or Firm*—Hutchins, Wheeler & Dittmar

(57) ABSTRACT

A TiN film and an ARL-SiON film (plasma $SiO_2$ film+ plasma SiON film) are deposited on a metal interconnection layer. The film thickness and the film quality of the ARL-SiON film is optmized to minimize the reflectance factor of the metal interconnection layer, and the composition of the ARL-SiON film is so adjusted that the ARL-SiON film can be easily dissolved by a hydrofluoric acid in a later process. The multi-layer antireflection layer composed of the TiN film and the ARL-SiON film, and the underlying metal interconnection layer are continuously dry-etched in the same processing chamber. At this time, the basis of the etching gas is composed of a combination of chlorine based gases (Cl containing gas such as $Cl_2$, $BCl_3$, HCl) which is the same as that used for etching the metal film. Furthermore, when the etching gas composed of a combination of $Cl_2$ and $BCl_3$ is used, the mixing ratio of the etching gas is changed. Thus, the inorganic antireflection layer is hard of changing its film nature even if it is subjected to a wet removing treatment and a plasma ashing for the resist when the rework of the lithography becomes necessary.

22 Claims, 8 Drawing Sheets

- 16 INTERLAYER INSULATOR FILM
- 15 VIA HOLE
- 17 VIA HOLE BOTTOM
- 4 TiN ANTIREFLECTION LAYER
- 3 METAL MULTI-LAYER FILM
- 2 INSULATOR FILM
- 1 Si SUBSTRATE

- 16 INTERLAYER INSULATOR FILM
- 15 VIA HOLE
- 5a PLASMA SiON
- 4 TiN ANTIREFLECTION LAYER
- 3 METAL MULTI-LAYER FILM
- 2 INSULATOR FILM
- 1 Si SUBSTRATE

INTERCONNECTION FORMING METHOD UTILIZING AN INORGANIC ANTIREFLECTION LAYER

BACKGROUND OF THE INVENTION

The present invention relates to an interconnection forming method utilizing an inorganic antireflection layer.

Now, a conventional interconnection forming method utilizing an inorganic antireflection layer will be described with reference to FIG. 1, which is a diagrammatic sectional view of a semiconductor device for illustrating a technology of the interconnection forming method utilizing the conventional inorganic antireflection layer.

As shown in FIG. 1, when it is attempted to pattern a metal multi-layer 3 formed on an insulator film 2 formed on a silicon substrate 1, it is necessary to first pattern a photo resist (lithography). Ordinarily, the lithography is carried out by (1) depositing a photo resist on a wafer (on the insulator film 2 in this case) (resist deposition step), (2) exposing the photo resist to a desired pattern (exposure step), (3) developing the exposed resist (development step), and (4) checking whether or not the size of the pattern of the developed resist is satisfactory, whether or not the pattern of the developed resist is broken, and whether or not the pattern of the developed resist is deviated (check step).

Incidentally, in the check step of the lithography, if it is judged that the pattern of the developed resist is defective, it is necessary to execute the lithography again from the resist deposition step. However, since the patterned resist remains on the wafer, it is necessary to remove the remaining resist. For this purpose, the remaining resist is ashed with oxygen plasma or ozone and wet-removed with an organic removing liquid (removing step). Thereafter, the resist deposition step, the exposure step, the development step, and the check step are carried out. A process composed of the removing step, the resist deposition step, the exposure step, the development step, and the check step, is called a "rework".

In a patterning for a micro lithography, in particular, the lithography having a line width of a sub-micro or less, the photo resist is exposed by an excimer laser. However, the photo resist for the excimer laser has a tendency that the photo resist is thinned or disappears by reflection from a concavo-convex surface of the underlying film. In order to prevent this inconvenience, a TiN antireflection film 4 is formed on the metal multi-layer film 3, as shown in FIG. 1.

Recently, furthermore, although not shown in FIG. 1, it has been proposed to form on the TiN antireflection film 4 an organic antireflection coating (a nature near to the photo resist or a silica based type) or an inorganic antireflection layer (SiON film).

Comparing the organic antireflection coating with the inorganic antireflection layer, the inorganic antireflection layer is more excellent than the organic antireflection coating from the view point that a dry etching machines can be used and from the view point of the rework in the lithography.

The reason for this is that in the case of the organic antireflection coating, when the resist is removed, the organic antireflection coating will be removed together with the resist, and therefore, it is necessary to deposit the organic antireflection coating once again. Accordingly, the number of steps in the rework of the lithography becomes much than that required when the inorganic antireflection layer is used, by one.

On the other hand, after the metal multi-layer film under the patterned resist is dry-etched using the patterned resist as a mask, the resist and others are removed, use of the inorganic antireflection layer needs one or two additional steps in comparison with use of the organic antireflection coating.

Furthermore, in connection with an etching chamber, an etching gas for the organic antireflection coating inevitably etches a deposition adhered in the etching chamber, with the result that an increase of so called particles and a problem of flaking are apt to occur.

At the present time, when the organic antireflection coating is formed on an AlCu film constituting a metal interconnection (precisely, on TiN film formed on the AlCu film), the rework becomes difficult, because both of the organic antireflection coating and the resist for the Kr laser are difficult to remove, so that a residue remains.

In addition, the particles generated in the etching step are a significant problem. The organic antireflection coating is not suitable when the AlCu film is etched. However, the organic antireflection coating is used on a polysilicon film and a silicide film.

Because of the above mentioned reasons, when the antireflection coating is used in the lithography for preparation of the patterning of the metal interconnection, it is preferred to use the inorganic antireflection layer.

However, a problem has been encountered when the inorganic antireflection layer is used as the antireflection coating.

Japanese Patent Application Pre-examination Publication No. JP-A-09-055351 (an English abstract of which is available from the Japanese Patent Office Home Page and the content of the English abstract is also incorporated by reference in its entirety into this application) proposes a method including the steps of depositing an antireflection coating formed of a SiON film on an interconnection layer, and executing a plasma treatment by $N_2$, $O_2$ and others to convert the nature of the surface of the SiON film so as to form a protection film, for the purpose of stabilizing the surface of the antireflection coating. In the structure formed by this method, however, the nature is converted in only the thickness of a few 10 Å at the surface of the SiON film. Therefore, if it is kept as it is, the surface is stable, but it is sensitive to a chemical treatment such as the rework of the lithography, so that the film nature is changed with high possibility.

BRIEF SUMMARY OF THE INVENTION

Accordingly, it is an object of the present invention to provide an interconnection forming method utilizing an inorganic antireflection layer, which has overcome the above mentioned problems.

Another object of the present invention is to provide an interconnection forming method utilizing an inorganic antireflection layer, which is hard of changing its film nature even if it is subjected to a wet removing treatment and a plasma ashing for the resist when the rework of the lithography becomes necessary because of a misalignment of the patterned resist (to such a degree that the patterned resist is deviated from the underlying pattern to make a circuit formation impossible) and/or another patterning defective in the lithography.

The above and other objects of the present invention are achieved in accordance with the present invention by an interconnection forming method utilizing an inorganic antireflection layer, wherein an inorganic antireflection layer is formed by forming an inorganic metal type antireflection film on a metal interconnection layer, depositing a plasma SiON film on the inorganic metal type antireflection film, and depositing a plasma $SiO_2$ film on the plasma SiON film. Here, the inorganic metal type antireflection film can be formed of for example a TiN film, but is in no way limited to only the TiN film.

In one embodiment of the interconnection forming method utilizing the inorganic antireflection layer in accordance with the present invention, the inorganic antireflection layer is continuously dry-etched by use of a gas including $Cl_2$, in a chamber in which the metal interconnection layer is dry-etched, so that the inorganic antireflection layer and the metal interconnection layer are continuously dry-etched in the same chamber. Furthermore, in this continuous dry-etching, the inorganic antireflection layer is dry-etched under a condition having a high ratio of $BCl_3$, and the metal interconnection layer is dry-etched under a condition having a low ratio of $BCl_3$.

In a preferred embodiment of the interconnection forming method utilizing the inorganic antireflection layer in accordance with the present invention, after the above mentioned continuous dry-etching, an over-etching process is carried out by a dry etching, and furthermore, after an ashing treatment is carried out, a wet removing treatment is carried out by using an organic removing liquid including 0.1% to 3% of ammonium fluoride and 10% to 80% of water, so that an etching deposition which occurred in the dry etching is removed together with the inorganic antireflection layer.

If the removing effect by the organic removing liquid is not satisfactory, in order to make it easy to remove the inorganic antireflection layer, an oxide film dry etching and an ashing using an $O_2/CF_4$ gas containing $CF_4$ of 0% to 10% in the ratio to the amount of $O_2$, are carried out before the removing treatment by the organic removing liquid.

If the plasma SiON of the inorganic antireflection layer remains, after an interlayer insulator film is formed, a via hole is formed by a via hole etching, and then, the remaining plasma SiON at the bottom of the via hole is removed by an organic removing liquid.

In another preferred embodiment, a hard mask formed of an insulator film such as a plasma SiON film, is formed between the plasma SiON film and the inorganic metal type antireflection film of the inorganic antireflection layer.

In this case, after the plasma SiON film of the inorganic antireflection layer and the hard mask are dry-etched, the resist is removed by the ashing, and thereafter, the metal interconnection layer is dry-etched by using the hard mask.

Alternatively, just before the dry etching of the metal interconnection layer, the wet removing treatment using the organic removing liquid is carried out, so that the plasma SiON film of the inorganic antireflection layer and the deposition are removed, and thereafter, the metal interconnection layer is dry-etched.

As mentioned above, in the interconnection forming method utilizing the inorganic antireflection layer in accordance with the present invention, two kinds of antireflection layer, namely, the inorganic metal type antireflection film and an ARL-SiON film (plasma $SiO_2$ film+plasma SiON film) are deposited on the metal interconnection layer (a metal multi-layer film composed of a combination of any at least two of AlCu, TiN, TiW and Ti). With this feature, it is possible to minimize a halation attributable to a concavo-convex surface of the metal interconnection layer.

Furthermore, the resistance to migration is not lowered, and the resistance of a via hole contact connecting between interconnections of different levels does not increase. In this connection, not only the film thickness and the film quality of the ARL-SiON film is optimized to minimize the reflectance factor of the metal interconnection layer, but also the composition of the ARL-SiON film is so adjusted that the ARL-SiON film can be easily dissolved by a hydrofluoric acid in a later process.

In the case that the inorganic antireflection layer composed of the inorganic metal type antireflection film and the ARL-SiON film, and the underlying metal interconnection layer are continuously dry-etched in the same processing chamber, the basis of the etching gas is composed of a combination of chlorine based gases (Cl containing gas such as $Cl_2$, $BCl_3$, HCl) which is the same as that used for etching the metal film. Therefore, the change of the atmosphere within the processing chamber can be limited to a minimum.

Furthermore, in the case that the etching gas composed of a combination of $Cl_2$ and $BCl_3$ is used, it is possible to adjust the CD (critical dimension) shift amount and the selective etching ratio between the inorganic antireflection layer and the photo resist, by changing the mixing ratio of the etching gas. Here, assuming that the resist pattern size in the lithography is expressed by "CD1" and the resist pattern size after the etching is expressed by "CD2", the CD shift amount can be defined as the difference "CD1–CD2".

As mentioned above, it is possible to overcome the problems in the lithography by forming on the metal interconnection layer the inorganic antireflection layer composed of the inorganic metal type antireflection film and the ARL-SiON film. However, if the SiON remains on the metal interconnection film, it is expected that an inconvenience occurs. This inconvenience can be exemplified by a stopping of an etching in a via hole forming processing or a lowered reliability of the interlayer insulator film or a film peeling-off. However, the ARL-SiON film can be effectively removed by the organic removing liquid including the ammonium fluoride and the water.

The above and other objects, features and advantages of the present invention will be apparent from the following description of preferred embodiments of the invention with reference to the accompanying drawings.

DETAILED DESCRIPTION OF THE INVENTION

Now, embodiments of the present invention will be described with reference to the drawings.

Embodiment 1

Figure 1:
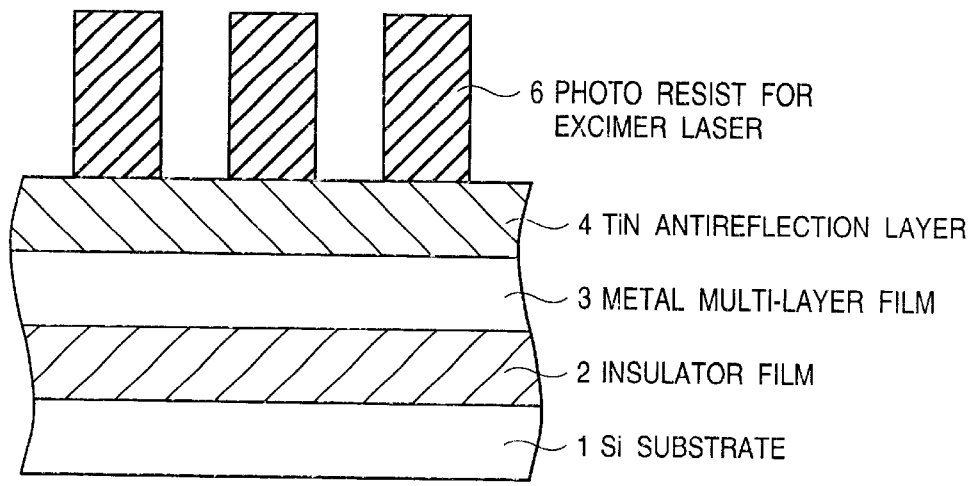
FIG. 1 is a diagrammatic sectional view of a semiconductor device for illustrating the interconnection forming method utilizing the conventional inorganic antireflection layer.
Figure 2:
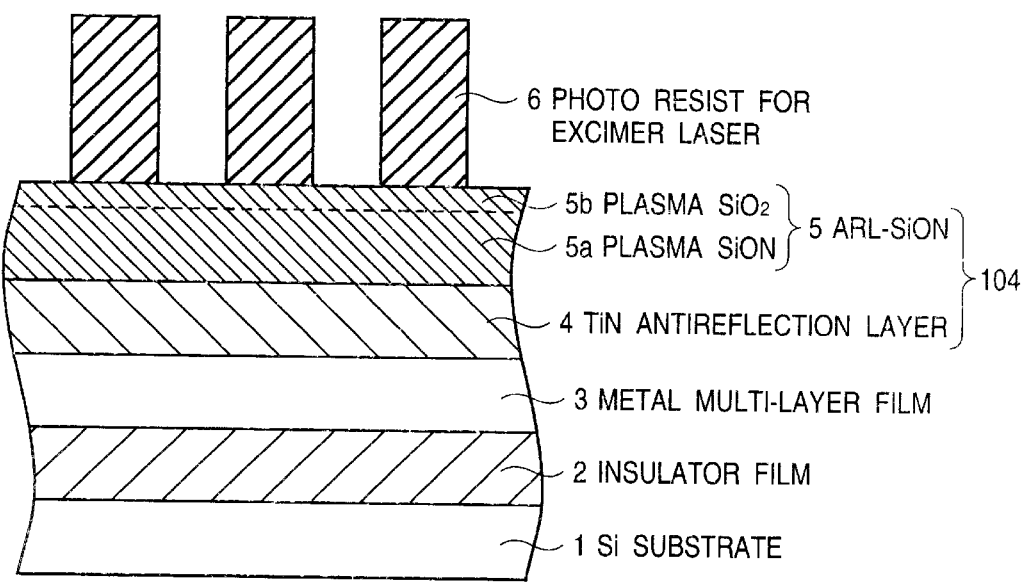
FIG. 2 is a diagrammatic sectional view of a semiconductor device for illustrating the interconnection forming method utilizing the inorganic antireflection layer in accordance with the present invention.
Figure 8:
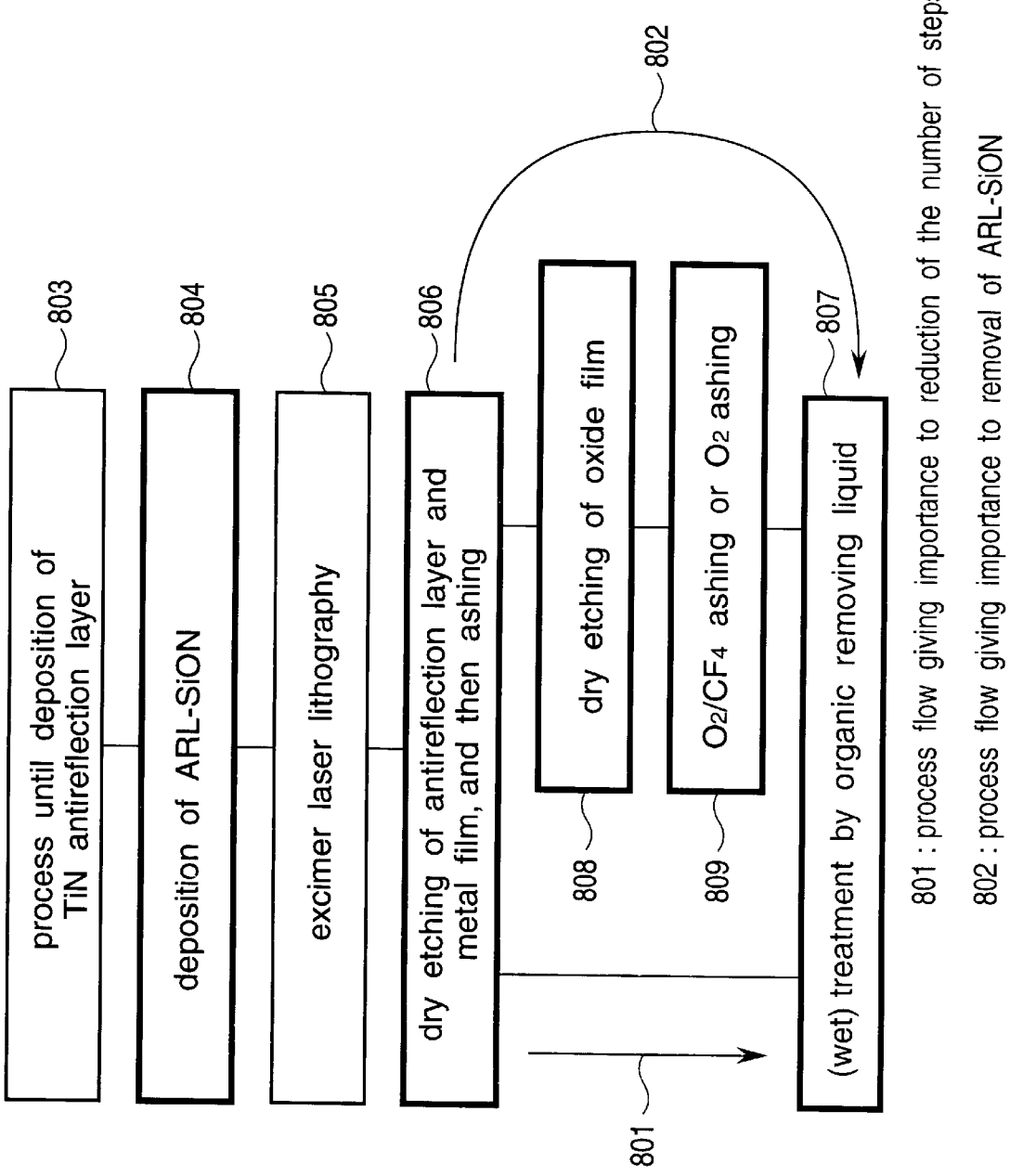
FIG. 8 is a flow chart illustrating the process flow in the interconnection forming method utilizing the inorganic antireflection layer in accordance with the present invention.

Referring to FIG. 2, there is shown a diagrammatic sectional view of a semiconductor device for illustrating the interconnection forming method utilizing the inorganic antireflection layer in accordance with the present invention. In FIG. 2, elements corresponding to those shown in FIG. 1 are given the same Reference Number, and explanation thereof will be omitted. FIG. 8 is a flow chart illustrating the process flow in the interconnection forming method utilizing the inorganic antireflection layer in accordance with the present invention, and the Embodiment 1 is a process flow designated by Reference Number 801 in FIG. 8.

As shown in a step 803 in FIG. 8, the process until formation of a TiN antireflection film 4 is carried out similarly to the prior art process. Then, as shown in FIG. 2, an ARL-SiON film 5 is formed on the TiN antireflection film 4 (step 804 in FIG. 8), to form a multi-layer antireflection layer 104 composed of the TiN antireflection film 4 and ARL-SiON film 5. This ARL-SiON film 5 is constituted of a plasma SiON (called a "P-SiON" hereinafter) film 5a formed on the TiN antireflection film 4 and a plasma $SiO_2$ (called a "P-$SiO_2$" hereinafter) film 5b formed on the P-SiON film 5a. Here, the film quality of the ARL-SiON film 5 is Si-rich as a whole (the term "Si-rich" means that a ratio of Si is high).

Figure 15:
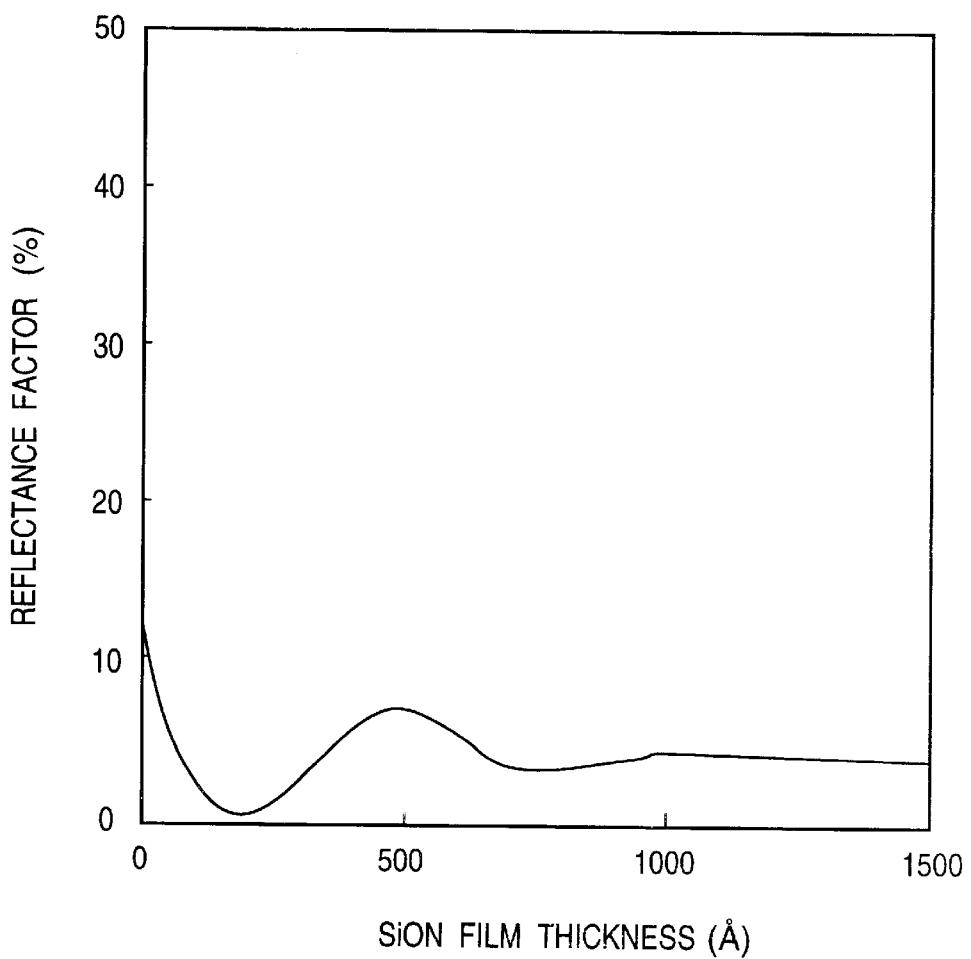
FIG. 15 is a graph showing the change of the reflectance factor when the thickness of the P-SiON film is changed.

The film thickness of the multi-layer antireflection layer 104 is adjusted to make the reflectance factor less than 8% in a KrF line region. When the multi-layer film including the Si-rich SiON film is used, as shown in FIG. 15, the reflectance factor is less than 8% if the thickness of the SiON film is not less than 100 Å.

Figure 13:
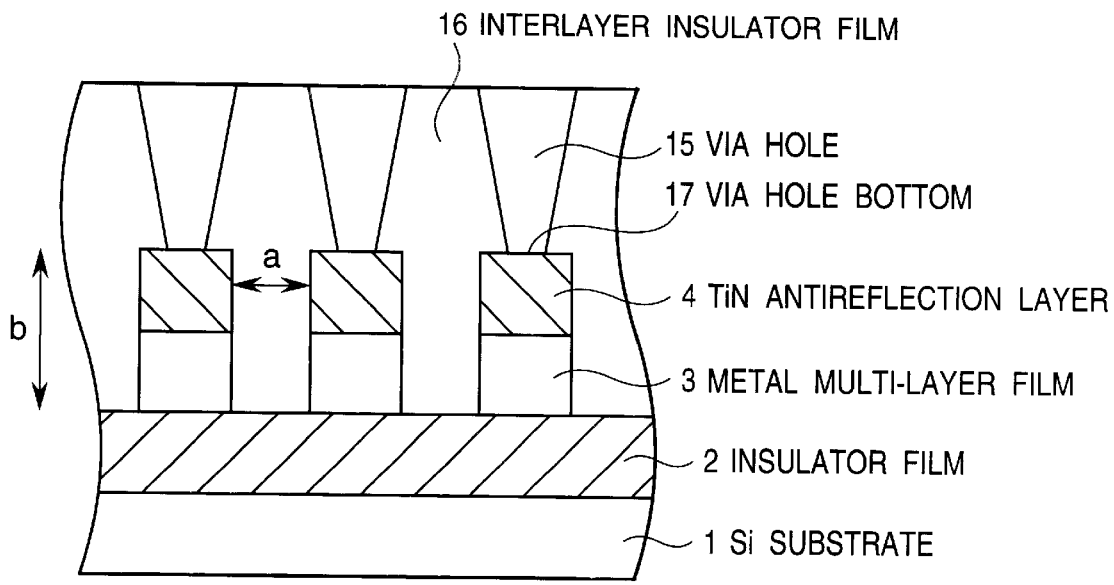
FIG. 13 is a diagrammatic sectional view of a semiconductor device for illustrating the condition after the etching for patterning the interconnection layer, the deposition of the interlayer insulator film and the etching for the formation of the via hole are carried out.

Furthermore, the film thickness of the TiN antireflection film 4 is determined to stop an etching by the TiN antireflection film 4 when a via hole is formed in an interlayer insulator film in a later process. For example, a minimum thickness of the TiN antireflection film 4 is about 250 Å, in order to ensure that as shown in FIG. 13, in an oxide film etching for forming a via hole 15, a bottom 17 of the via hole is stopped by the TiN antireflection film 4 so that the via hole 15 never penetrates into the metal multi-layer film 3. Incidentally, if the via hole 15 penetrates into the metal multi-layer film 3, the interconnection resistance increases, and the "ability to remove strip residue" is deteriorated.

Thereafter, a lithography using an excimer laser is carried out for the metal film 3 covered with the multi-layer antireflection layer 104 (step 805 in FIG. 8). Specifically, as shown in FIG. 2, a photo resist 6 for an excimer layer is deposited on the multi-layer antireflection layer 104, and then, is patterned to a desired shape.

Figure 3:
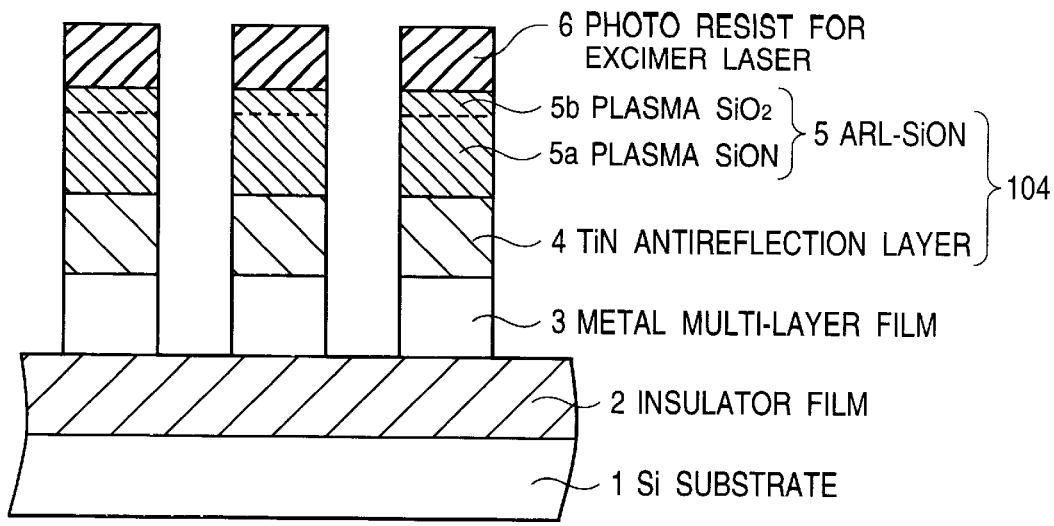
FIG. 3 is a diagrammatic sectional view of a semiconductor device for illustrating the condition after the etching, in the interconnection forming method utilizing the inorganic antireflection layer in accordance with the present invention.

Furthermore, as a step 806 in FIG. 8, a dry etching using a chlorine based gas is carried out by using the patterned photo resist 6 for the excimer laser. As a result, as shown in FIG. 3, the multi-layer antireflection layer 104 and the underlying metal multi-layer film 3 are patterned.

Ordinarily, the dry etching of the SiON film is carried out by using a plasma gas including a fluorine. Here, since the SiON film is Si-rich, the SiON film can be dry-etched by use of a chlorine based gas without substantially lowering the etching rate.

Figure 4:
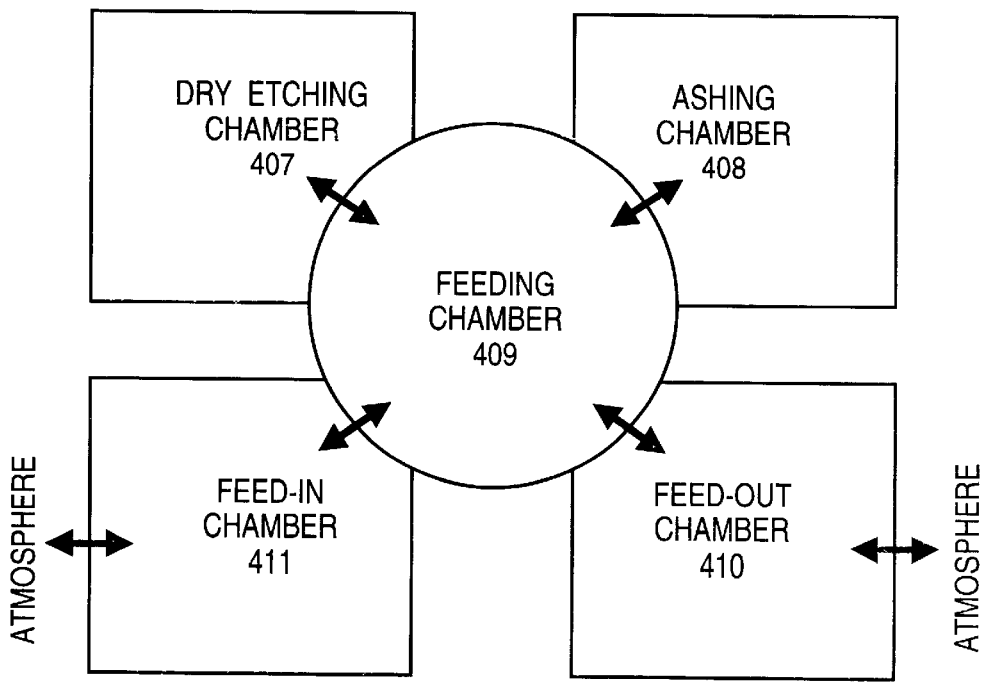
FIG. 4 is a block diagram diagrammatically illustrating a system for carrying out the etching and the ashing, in the interconnection forming method utilizing the inorganic antireflection layer in accordance with the present invention.

In a system shown in FIG. 4, this ARL-SiON film is etched in a dry etching chamber 407 in which the metal interconnection layer is etched. Namely, the ARL-SiON film and the metal interconnection layer are etched in the same chamber, it is possible to prevent various problems attributable to the fact that a reaction product is brought into contact with atmosphere (for example, residue, facetting, after corrosion, increased waste, size variation, etc.).

Furthermore, after this dry etching, the substrate is vacuum-conveyed to another chamber (ashing chamber) 408, in which the ashing and a remaining chlorine removal are carried out. At this time, the step 806 in FIG. 8 is completed, and the resist 6 is removed.

Incidentally, the machine used for the dry etching can be selected from various different type machines inducing an ECR (electron cycrotron resonance) type, ICP (inductive-coupled plasma) type, a helicon plasma source type, a two-frequency RIE (reactive ion etching) type, a two-power supply RIE type, a parallel plate type, etc.

Figure 5:
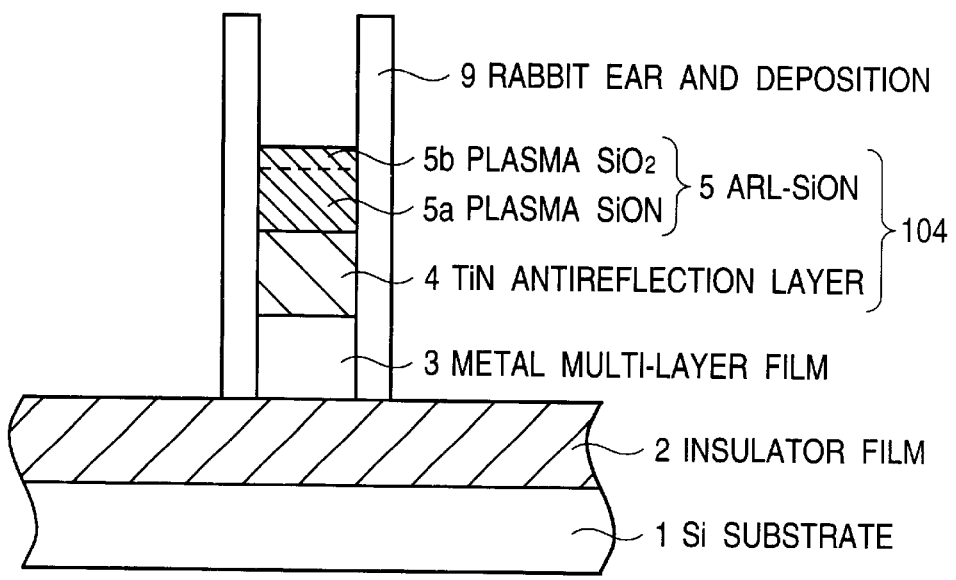
FIG. 5 is a diagrammatic sectional view of a semiconductor device for illustrating the condition after the etching and the ashing, in the interconnection forming method utilizing the inorganic antireflection layer in accordance with the present invention.

In the above mentioned dry etching, there remains a "rabbit ear and deposition" 9 as shown in FIG. 5, which includes a side wall etching deposition on a side wall of the patterned interconnection and rabbit ear (an etching deposition higher than patterned interconnection). Furthermore, also shown in FIG. 5, the patterned ARL-SiON film 5 remains on the patterned metal interconnection.

Here, this ARL-SiOn film 5 is an electrically insulative film having a high resistance, and therefore, if the patterned ARL-SiON film 5 remains, a capacitance between interconnections increases, with the result that the velocity of electrons moving in the circuit drops, and accordingly, the signal response is deteriorated. In addition, if an interlayer insulator film is formed in the condition that the patterned ARL-SiON film 5 remains on the patterned metal interconnection, the "ability to fill up between interconnections" of the interlayer insulator film is lowered, because the aspect ratio becomes large because of the remaining patterned ARL-SiON film 5. Furthermore, the "ability to closely contact" of the interlayer insulator film 5 is lowered, because the patterned ARL-SiON film 5 has a rough surface because of the etching using a removing liquid, carried out after the metal interconnection etching, and because the ARL-SiOn film 5 has a film stress different from that of the interlayer insulator film. Furthermore, if the patterned ARL-SiON film 5 remains on the patterned metal interconnection, when a via hole is formed to penetrate through the interlayer insulator film, there is possibility that the etching is stopped at the ARL-SiON film. In this condition, a conductive film is formed to fill up the via hole, the resistance of the via hole contact connecting between interconnections of different levels becomes abruptly large. Therefore, it is necessary to remove the ARL-SiON film 5 before the conductive film is formed to fill up the via hole.

In view of the above mentioned inconvenience, after the multi-layer antireflection layer 104 and the underlying metal multi-layer film 3 are patterned by the etching, the "rabbit ear and deposition" 9 and the remaining ARL-SiON film 5 shown in FIG. 5 are simultaneously removed by a wet removing treatment (step 807 in FIG. 8).

Figure 6:
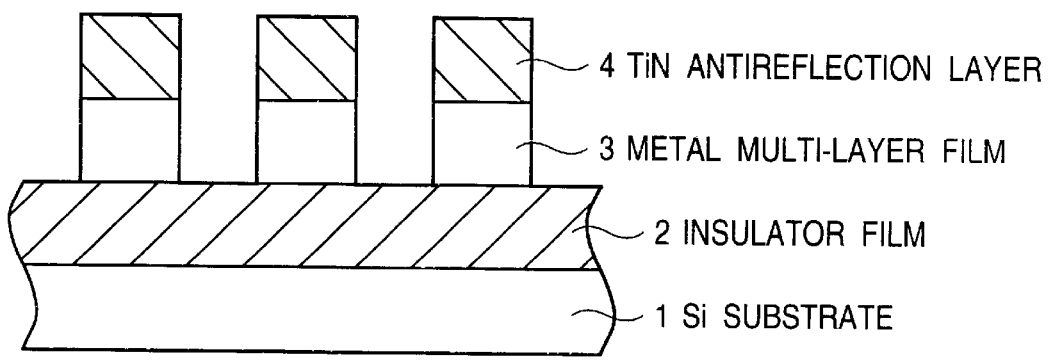
FIG. 6 is a diagrammatic sectional view of a semiconductor device for illustrating the condition in which the ARL-SiON film and the deposition are completely removed by the wet removing treatment using the organic removing liquid, in the interconnection forming method utilizing the inorganic antireflection layer in accordance with the present invention.

This process in which the step 807 is carried out after the step 806, is a process flow 801 giving importance to reduction of the number of steps, as shown in FIG. 8. In this case, if the upper P-SiO$_2$ film of the ARL-SiON film 5 is thin, the "rabbit ear and deposition" 9 and the remaining ARL-SiON film 5 can be simultaneously removed by an organic removing liquid including the ammonium fluoride and the water. The condition after this step 807 is shown in FIG. 6.

Incidentally, if the ammonium fluoride is mixed with the water, a hydrofluoric acid is generated, and therefore, the oxide film is wet-etched. Accordingly, it is preferable to previously form the SiON film under a condition that the ratio of Si is low. However, under this condition, it is not possible to form the Si-rich SiON film, and therefore, it is not possible to minimize the reflectance factor. As a result, a preferable composition is that Si:O:N=5:3:1. At this time, a value of "k" becomes 0.50 to 0.65. This ratio of Si:O:N= 5:3:1 is not a strict value. It is sufficient if the ratio of Si is in the range of 45% to 65% of the whole.

Here, "k" is an attenuation coefficient when a complex refractive factor of a medium is expressed by "n+ik", and has a relation to an absorption factor $\alpha$, as expressed by $\alpha=(4\pi/\lambda_0)$, where "n" is a refractive factor and $\lambda_0$ is a wavelength of light in vacuum. Therefore, "k" is a parameter indicative of the degree of attenuation of the light entering the medium.

In addition, a preferable film thickness of the multi-layer antireflection layer is that: the P-SiO$_2$ film is 50 Å to 100 Å, the P-SiON film is 100 Å to 500 Å, and the TiN film is not less than 250 Å.

The above mentioned numerical values of the film thickness was obtained by executing an optical computation based on a conventional reflectance factor calculation method and further by taking the followings into consideration:

If the P-SiON film has the film thickness of not less than 100 Å, the reflectance factor is small;

The upper limit of the film thickness which can be removed by a wet removing treatment using the organic removing liquid, is that the P-SiO$_2$ film is 100 Å, the P-SiON film is 500 Å. The thinner the film thickness is, the film can be easily removed:

The minimum thickness of the TiN film required to stop the via hole etching carried out in a later process by the TiN film is 250 Å. The thicker the film thickness of the TiN film is, the etching can be surely stopped by the TiN film and the etching margin becomes large;

The lower limit of the P-SiO$_2$ film is a minimum thickness required for stability of the P-SiON film.

Now, the via hole etching will be described in detail. The via hole etching is an oxide film etching, carried out after the etching for pattering the metal interconnection, for etching an interlayer insulator film 16 which is deposited to cover the metal interconnections and to fill up a space between the metal interconnections. The interlayer insulator film 16 can be formed of a BPSG (borophosphosilicate glass), NSG (non-silicate glass), P-SiO$_2$, or a multi-layer film composed of these materials. On the interlayer insulator film formed with the via hole, an upper level metal interconnection layer is deposited and patterned, so that the via hole is filled up with the metal of the upper level metal interconnection layer, and therefore, the patterned upper level metal interconnection is electrically connected through the via hole to the lower level metal interconnection covered by the interlayer insulator film. Namely, the via hole is a vertical hole for electrically connecting between interconnections of different levels.

Here, when the metal interconnection under the TiN film is formed of AlCu, the surface of AlCu is chemically changed by a conventional gas (fluorocarbon based gas) used for etching the oxide film, with the result that the resistance of AlCu becomes large. Furthermore, the TiN film is sputtered so that TiN is deposited on a side wall of the via hole, with the result that the shape of the via hole is deformed, and a deposition occurs in a later process. Therefore, it is necessary to stop the oxide film etching at the TiN film.

Because of the above mentioned reasons, it is a conventional practice that the via hole etching has a high selective etching ratio between the interlayer insulator film and the TiN film. As a result, it is hard to etch the SiON film. Furthermore, the film thickness of the TiN film is preferred to be thick in the extent that a problem does not occurs in the capacitance between interconnections and in the aluminum etching.

Here, the capacitance between interconnections will be described. The insulator film is filled up between adjacent interconnections. If the spacing between adjacent interconnections becomes small, the velocity of electrons moving in the interconnection becomes slow, since the adjacent interconnections separated by the insulator film behaves as a capacitor.

Assuming that the dielectric constant of the insulator film is at a constant, the smaller the spacing ("a" in FIG. 13) between adjacent interconnections is, and the larger the height ("b" in FIG. 13) of the interconnection is, the capacitance between interconnections becomes large. This means that the smaller the aspect ratio (b/a) between the interconnections is, the circuit can operate at a high speed.

Now, one example of the film structure and the film thickness shown in FIG. 2 will be shown.

The photo resist 6 for excimer laser is KrF resist (7000 Å)

The plasma $SiO_2$ film 5b is P-$SiO_2$ (100 Å)

The plasma SiON film 5a is P-SiON (350 Å)

The TiN antireflection film 4 is TiN (500 Å)

The metal multi-layer film 3 is composed of AlCu (2500 Å), TiN (300 Å) and Ti (200 Å)

The insulator film 2 is NSG

The substrate 1 is Si

The following is a specific example of the dry etching in the step 806. An inductive-coupled plasma source etcher is used.

First step (for etching the multi-layer antireflection layer 104 and the underlying metal multi-layer film 3)

| flow rate | $Cl_2$ | 50SCCM |
|---|---|---|
| | $BCl_3$ | 30SCCM |
| | $CHF_3$ | 5SCCM |
| magnetic flux density | | 8mT |
| source coil power | | 1200W |
| bias power | | 100W |
| temperature | | 40° C. |

Second step (for overetching)

| flow rate | $Cl_2$ | 50SCCM |
|---|---|---|
| | $BCl_3$ | 30SCCM |
| | $CHF_3$ | 7SCCM |
| | Ar | 40SCCM |
| magnetic flux density | | 8mT |
| source coil power | | 700W |
| bias power | | 70W |
| temperature | | 40° C. |

Next, a specific example of the organic removing liquid and the removing treatment condition in the step 809 will be shown.

The organic removing liquid is composed of 70% of DMSO (dimethyl sulfoxide), 1% of ammonium fluoride and 29% of water. The treatment condition is that the temperature is 30° C. and the etching time is 10 minutes.

Thus, the feature of the first embodiment can be summarized as follows:

In the lithography (resist patterning), the resistance to halation in the excimer laser exposure to the resist can be elevated.

Since the uppermost layer is formed of P-$SiO_2$ which is chemically more stable than TiN, the rework of the lithography becomes easy.

Since the ARL-SiON film is etched by a fluorine based gas in a dry etching chamber in which the metal interconnection layer is etched, the number of steps can be reduced, and it is not necessary to add an instrument being used (the instrument used for only the etching of the ARL-SiON film is not necessary). In addition, it is possible to prevent the various problems attributable to the fact that a reaction product is brought into contact with atmosphere (for example, residue, facetting, after corrosion, increased waste, size variation, etc.).

The etching of the ARL-SiON film in the inorganic antireflection layer does not cause the increase of the particles within the etching chamber, which would have occurred in etching the organic antireflection coating (polyimide based coating, the coating having the composition similar to that of the resist, or the coating mainly composed of organic matter CxHy).

Since the ARL-SiON film in the inorganic antireflection layer can be made thinner than the organic antireflection coating, the aspect ratio (b/a in FIG. 13) can be made small. This is advantageous in the micropatterning and the resistance to charge-up.

If the ammonium fluoride based removing liquid is used in a condition mixed with the organic removing liquid and the water, a hydrofluoric acid is generated, and therefore, the ARL-SiON film can be removed together with the side wall deposition. Therefore, it s possible to easily remove the ARL-SiON film in the inorganic antireflection layer on the metal interconnection of the structure including AlCu. For example, an amine-based organic removing liquid can remove the deposition but cannot remove the inorganic antireflection layer.

If the ratio Si:O:N in the SiON film is set to be 5:3:1, when the ARL-SiON film is deposited on the TiN antireflection film, it is possible to minimize the reflection by the metal film, and also, the etch rate of the oxide film and the SiON film by the hydrofluoric acid is high.

Incidentally, when the ARL-SiON film is thick, or when the concentration of the hydrofluoric acid is low, there is possibility that the ARL-SiON is not completely removed, namely, the ARL-SiON remains. In this case, the process flow 802 shown in FIG. 8 (Embodiment 2 ) is used, it is possible to completely remove the ARL-SiON without deteriorating the "ability to remove strip residue" and without etching the TiN film.

Embodiment 2

The Embodiment 2 is the process flow 802 giving importance to the removal of the ARL-SiON film, and is characterized in that steps 808 and 809 in FIG. 8 are executed prior to the wet etching step 807 which is the last step in the Embodiment 1. Now, the Embodiment 2 will be described in detail.

Figure 7:
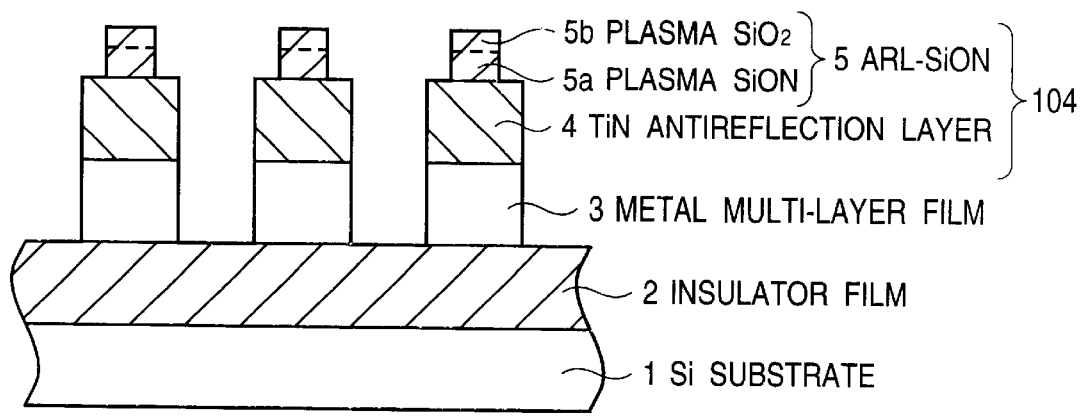
FIG. 7 is a diagrammatic sectional view of a semiconductor device for illustrating the condition in which the ARL-SiON film remains after the wet removing treatment using the organic removing liquid, in the interconnection forming method utilizing the inorganic antireflection layer in accordance with the present invention.

When the lower P-SiON film 5a in the ARL-SiON film 5 is thick, or when the concentration of the hydrofluoric acid is low, or alternatively when the time of the wet removing treatment is short, the ARL-SiON film 5 remains in a half-and-half condition as shown in FIG. 7. The Embodiment 2 was invented in order to overcome this problem.

In this embodiment, after the condition shown in FIG. 5, a dry etching is carried out under a conventional oxide film dry etching using the fluorocarbon based gas for a time not longer 10 seconds (step 808 in FIG. 8), and then, an $O_2$ plasma ashing using an $O_2$ gas containing $CF_4$ of 0% to 10% in the ratio to the amount of $O_2$ (step 809 in FIG. 8). Thereafter, the wet removing treatment using the organic removing liquid (step 807 in FIG. 8) is carried out. As a result, the condition shown in FIG. 6 is obtained.

The oxide film dry etching is required to remove the P-$SiO_2$ film. But, since the selective etching ratio between $SiO_2$ and SiON is high, the metal interconnection layer 3 and the TiN antireflection film 4 are never faceted.

On the other hand, if the ashing is not executed, the "ability to remove strip residue" is deteriorated, which is considered to be influenced by the deposition generated in the oxide film etching. However, by executing the plasma treatment using the mixed gas of $O_2$ and $CF_4$ or the plasma treatment using the gas of $O_2$, the rabbit ear and the side wall deposition become easily removable, and then are completely removed by the succeeding wet removing treatment using the organic removing liquid.

The following is one specific example of the condition for the oxide film dry etching in the step 808:

RIE etcher

| flow rate | CF$_4$ | 40SCCM |
|---|---|---|
| | CHF$_3$ | 20SCCM |
| gas pressure | | 10Pa |
| RF power | | 600W |
| temperature | | 40° C. |

The following is one specific example of the condition for the ashing in the step 809:

microwave asher

| flow rate | O$_2$ | 900SCCM |
|---|---|---|
| | CHF3 | 5SCCM |
| magnetic flux density | | 500mT |
| power | | 1100W |
| temperature | | 40° C. |

Embodiment 3

The ARL-SiON film can be etched under the etching condition for the AlCu film. However, if the partial pressure of BCl$_3$ is increased, the ARL-SiON film can be etched with no residue. In this case, a three-step etching is required, which will be described below.

Since BCl$_3$ is a reducing gas, the oxide film and the SiON is easily etched. Therefore, the composition of the side wall deposition changes, and also the thickness of the side wall deposition changes, with the result that the CD shift amount changes. This means that it is possible to control the size.

Furthermore, in the case of BCl$_3$-rich as compared with Cl$_2$-rich, when the etching removes the TiN antireflection film 4 in the etching of the ARL-SiON film, a notch (side etching) is hardly formed on an upper portion of the AlCu metal multi-layer film 3.

The following is a specific example of the dry etching condition (which is hard to generate the residue). An inductive-coupled plasma source etcher is used.

First step (for ething the ARL-SiON film)

| flow rate | Cl$_2$ | 40SCCM |
|---|---|---|
| | BCl$_3$ | 40SCCM |
| | CHF$_3$ | 5SCCM |
| magnetic flux density | | 8mT |
| source coil power | | 1200W |
| bias power | | 100W |
| temperature | | 40° C. |

Second step (for etching the AlCu film)

| flow rate | Cl$_2$ | 50SCCM |
|---|---|---|
| | BCl$_3$ | 30SCCM |
| | CHF$_3$ | 5SCCM |
| magnetic flux density | | 8mT |
| source coil power | | 1200W |
| bias power | | 100W |
| temperature | | 40° C. |

Third step (for overetching)

| flow rate | Cl$_2$ | 50SCCM |
|---|---|---|
| | BCl$_3$ | 20SCCM |
| | CHF$_3$ | 7SCCM |
| | Ar | 40SCCM |
| magnetic flux density | | 8mT |
| source coil power | | 700W |
| bias power | | 70W |
| temperature | | 40° C. |

Embodiment 4

In the above mentioned Embodiments 1 to 3, the metal interconnection can be formed of a single layer of TiN film which does not include AlCu. In this case, the etching condition is the same as the Embodiment 2.

Embodiment 5

In the above mentioned Embodiments 1 to 4, the photo resist can be replaced with an electron beam exposure type photo resist Embodiment 6

Figure 9:
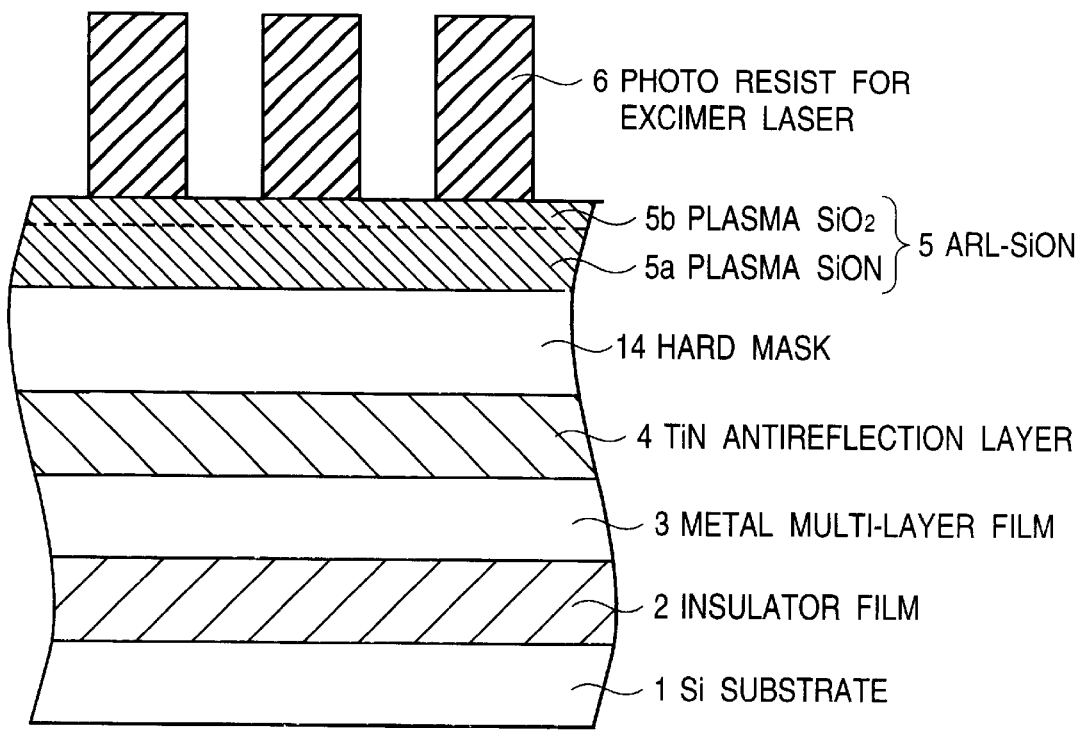
FIG. 9 is a diagrammatic sectional view of a semiconductor device for illustrating a different embodiment of the interconnection forming method utilizing the inorganic antireflection layer in accordance with the present invention.

As shown in FIG. 9, a thick-film hard mask 14 formed of an insulator film such as a plasma SiO$_2$ is formed between the TiN antireflection film 4 and the ARL-SiON film 5 in the multi-layer antireflection layer 104.

Figure 10:
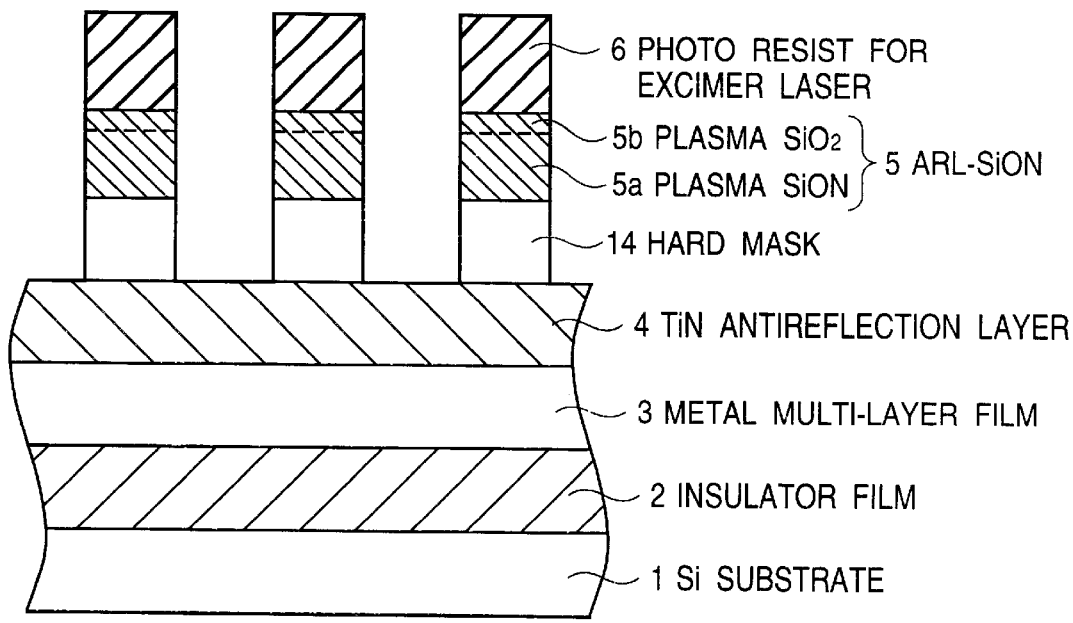
FIG. 10 is a diagrammatic sectional view of a semiconductor device for illustrating the condition after the ARL-SiON film and the hard mask are etched by an oxide film etching, in the different embodiment of the interconnection forming method utilizing the inorganic antireflection layer in accordance with the present invention.

Then, by using the patterned photo resist 6 as the mask, the ARL-SiON film 5 and the hard mask 14 are etched as shown in FIG. 10 in a conventional oxide film dry etcher in accordance with a conventional method.

Figure 11:
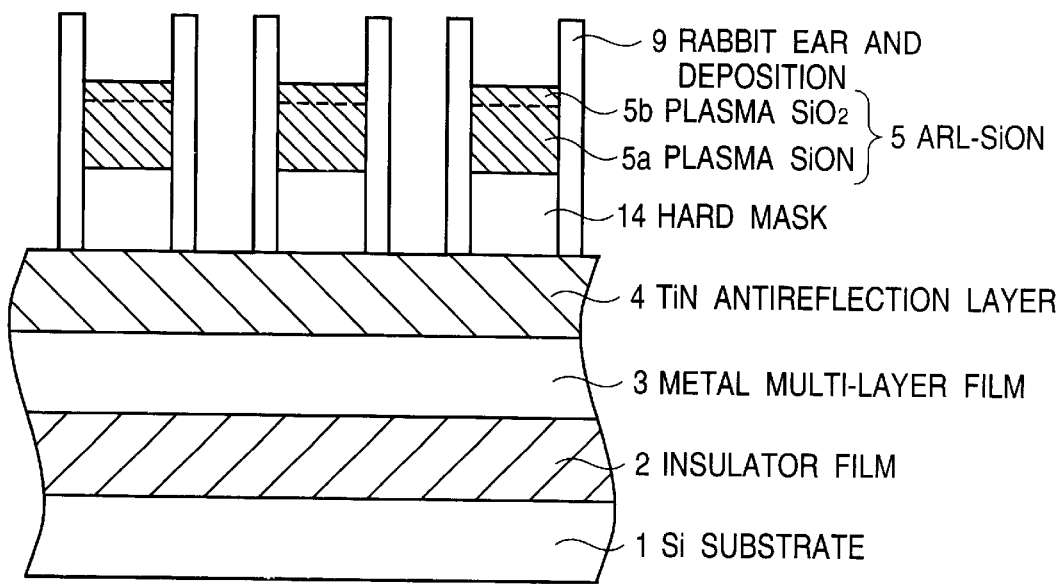
FIG. 11 is a diagrammatic sectional view of a semiconductor device for illustrating the condition after the ashing, in the different embodiment of the interconnection forming method utilizing the inorganic antireflection layer in accordance with the present invention.

Succeedingly, the ashing is carried out in a conventional ashing condition, so that the resist 6 is removed as shown in FIG. 11.

Figure 12:
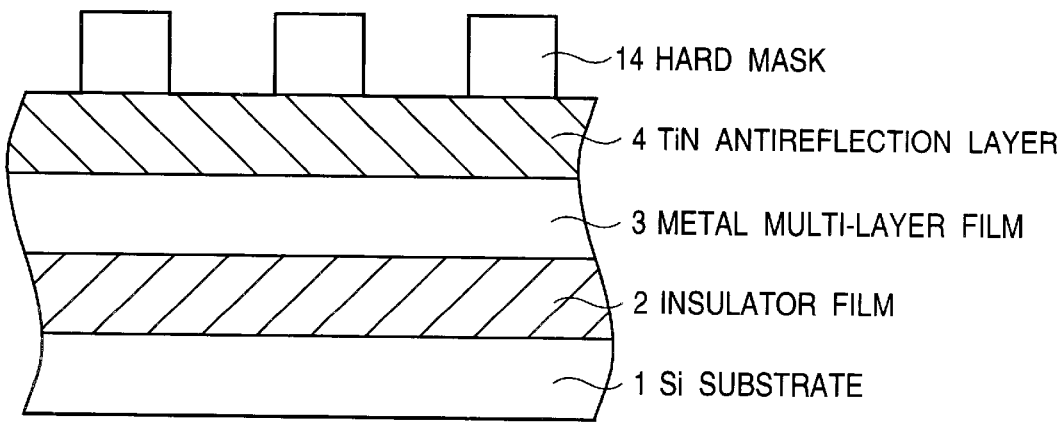
FIG. 12 is a diagrammatic sectional view of a semiconductor device for illustrating the condition after the wet removing treatment using the organic removing liquid, in the different embodiment of the interconnection forming method utilizing the inorganic antireflection layer in accordance with the present invention.

Thereafter, the wet removing treatment using the organic removing liquid is carried out (step 807 in FIG. 8), with the result that the condition shown in FIG. 12 can be obtained.

In this wet removing treatment, the ARL-SiON film may remain. Because the remaining ARL-SiON film is etch-removed in the succeeding process for etching the AlCu metal interconnection layer 3.

The later process is the same as those in the Embodiments 1 to 5, excepting that the hard mask 14 is used as the mask.

For example, in the case that this embodiment is applied to the Embodiment 2, after the ARL-SiON film 5 and the hard mask 14 are dry-etched, the resist is removed by the ashing, and then, the TiN antireflection film and the metal interconnection film are dry-etched using the patterned hard mask as the mask, and thereafter, the steps 808, 809, and 807 are carried out.

Embodiment 7

This embodiment exerts the advantage similar to that obtained in the process flow 802 shown in FIG. 8 giving the importance to the removal of the ARL-SiON film, without using the process flow 802.

Since the ARL-SiON film 5 is constituted of the Si-rich P-SiON film 5a and the P-SiO$_2$ film 5b, when the P-SiON remains as shown in FIG. 7 in the process flow 801 giving the importance to the reduction of the number of steps in FIG. 8, the following process is executed.

Figure 14:
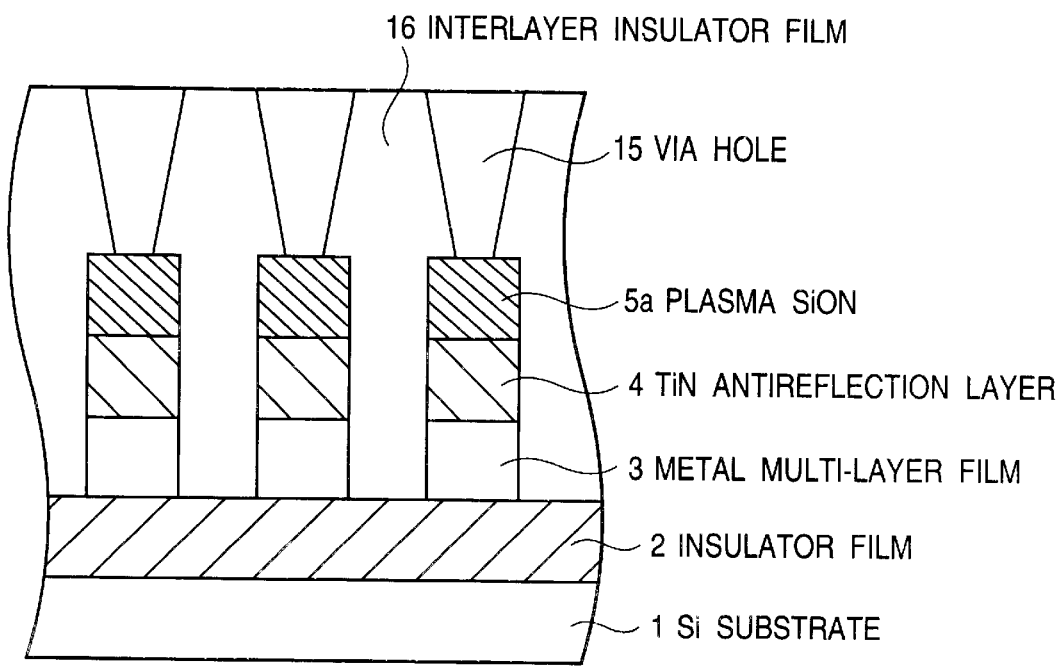
FIG. 14 is a diagrammatic sectional view of a semiconductor device for illustrating the condition after the etching for the formation of the via hole are carried out, in a further different embodiment of the interconnection forming method utilizing the inorganic antireflection layer in accordance with the present invention.

Referring to FIG. 14, an interlayer insulator film 16 is deposited in the condition that the ARL-SiON film 5 remains on the patterned metal interconnection film, and a via hole 15 is formed to penetrate through the interlayer insulator film 16. In this case, the P-SiON film 5a remains at the bottom 17 of the via hole 15, as shown in FIG. 14, although P-SiO$_2$ film 5b of the remaining ARL-SiON film 5 is removed by the via hole etching.

In this condition, if the via hole is filled up with a conductive film, a obtained via hole contact has a large resistance, in comparison with the condition shown in FIG. 13. Therefore, the wet treatment using the organic removing liquid is carried out, similarly to the final step 807 in FIG. 8. Therefore, the remaining SiON is etch-removed by the hydrofluoric acid, and the via hole resistance similar to the prior art shown in FIG. 13 can be obtained.

As seen from the above, the interconnection forming method utilizing the inorganic antireflection layer in accordance with the present invention can exerts the following advantages:

Since two kinds of antireflection layer, namely, the inorganic metal type antireflection film (for example, TiN film) and an ARL-SiON film (plasma SiO$_2$ film+plasma SiON film) are deposited on the metal interconnection layer (a metal multi-layer film composed of a combination of any at least two of AlCu, TiN, TiW and Ti), it s possible to minimize a halation attributable to a concavo-convex surface of the metal interconnection layer, and therefore, to prevent the problem in the resist patterning of the lithography.

Furthermore, the resistance to migration is not lowered, and the resistance of a via hole contact connecting between interconnections of different levels does not increase.

In the case that the inorganic antireflection layer composed of the inorganic metal type antireflection film and the ARL-SiON film, and the underlying metal interconnection layer are continuously dry-etched in the same processing chamber, the basis of the etching gas is composed of a combination of chlorine based gases (Cl containing gas such as Cl$_2$, BCl$_3$, HCl) which is the same as that used for etching the metal film. Therefore, the change of the atmosphere within the processing chamber can be limited to a minimum.

Furthermore, in the case that the etching gas composed of a combination of Cl$_2$ and BCl$_3$ is used, it is possible to adjust the CD (critical dimension) shift amount and the selective etching ratio between the inorganic antireflection layer and the photo resist, by changing the mixing ratio of the etching gas.

As mentioned above, it is possible to overcome the problems in the lithography by forming on the metal interconnection layer the inorganic antireflection layer composed of the inorganic metal type antireflection film and the ARL-SiON film. However, if the SiON remains on the metal interconnection film, it may be expected that an etching is stopped by the remaining SiON in a via hole forming processing or reliability of the interlayer insulator film is lowered, or a film peeling-off occurs. However, the ARL-SiON film can be effectively removed by the organic removing liquid including the ammonium fluoride and the water.

The invention has thus been shown and described with reference to the specific embodiments. However, it should be noted that the present invention is in no way limited to the details of the illustrated structures but changes and modifications may be made within the scope of the appended claims.

I claim:

1. An interconnection forming method utilizing an inorganic antireflection layer, wherein an inorganic antireflection layer is formed by:

forming an inorganic metal type antireflection film on a metal interconnection layer;

depositing a plasma SiON film on the inorganic metal type antireflection film; and depositing a plasma SiO$_2$ film on the plasma SiON film, said inorganic antireflection layer including the plasma SiON film and the plasma SiO$_2$ film.

2. An interconnection forming method claimed in claim 1, further comprising:

continuously dry-etching the inorganic antireflection layer and the metal interconnection layer using a gas including Cl$_2$ in the same chamber.

3. An interconnection forming method claimed in claim 2, wherein in the continuous dry-etching, the inorganic antireflection layer is dry-etched under a condition having a first ratio of BCl$_3$; and dry-etching the metal interconnection layer under a condition having a second ratio of BCl$_3$, wherein said first ratio is greater than said second first ratio.

4. An interconnection forming method claimed in claim 3, further comprising:

if there is remaining plasma SiON of the inorganic antireflection layer, after an interlayer insulator film is formed, forming a via hole by a via hole etching; and removing the remaining plasma SiON at the bottom of the via hole using an organic removing liquid.

5. An interconnection forming method utilizing an inorganic antireflection layer, wherein an inorganic antireflection layer is formed by:

forming an inorganic metal type antireflection film on a metal interconnection layer;

depositing a plasma SiON film on the inorganic metal type antireflection film;

depositing a plasma SiO$_2$ film on the plasma SiON film, said inorganic antireflection layer including the plasma SiON film and the plasma SiO$_2$ film;

continuously dry-etching the inorganic antireflection layer and the metal interconnection layer using a gas including Cl$_2$ in the same chamber;

performing an over-etching process by a dry etching; and after an ashing treatment is carried out, performing a wet removing treatment using an organic removing liquid including 0.1% to 3% of ammonium fluoride and 10% to 80% of water, so that an etching deposition which occurred during the continuous dry etching is removed together with any remaining plasma SiON film.

6. An interconnection forming method claimed in claim 5 wherein before the etching deposition is removed by the organic removing liquid, performing a plasma SiO$_2$ film dry etching and an ashing using an O$_2$/CF$_4$ gas containing CF$_4$ wherein the amount of CF$_4$ is varied in the range of 0% to 10% of the amount of O$_2$, are carried out in order to make it easy to remove the remaining plasma SiON film.

7. An interconnection forming method claimed in claim 5 further comprising:

forming a hard mask of an insulator film between the plasma SiON film and the inorganic metal type antireflection film of the inorganic antireflection layer.

8. An interconnection forming method claimed in claim 7, wherein after the plasma SiON film of the inorganic antireflection layer and the hard mask are dry-etched, a resist is removed by ashing; and dry-etching the metal interconnection layer using the hard mask.

9. An interconnection forming method claimed in claim 8 wherein, just before the dry etching of the metal interconnection layer, the wet removing treatment using the organic removing liquid is carried out, so that the plasma SiON film of the inorganic antireflection layer and the etching deposition are removed; and the metal interconnection layer is dry-etched.

10. An interconnection forming method claimed in claim 7 wherein just before the dry etching of the metal interconnection layer, the wet removing treatment using the organic removing liquid is carried out, so that the plasma SiON film of the inorganic antireflection layer and the etching deposition are removed; and the metal interconnection layer is dry-etched.

11. The interconnection forming method of claim 7, wherein said hard mask is formed of a plasma SiON film.

12. An interconnection forming method utilizing an inorganic antireflection layer, wherein an inorganic antireflection layer is formed by:

forming an inorganic metal type antireflection film on a metal interconnection layer;

depositing a plasma SiON film on the inorganic metal type antireflection film;

depositing a plasma $SiO_2$ film on the plasma SiON film, said inorganic antireflection layer including the plasma SiON film and the plasma $SiO_2$ film, wherein a hard mask formed of an insulator film, is formed between the plasma SiON film and the inorganic metal type antireflection film of the inorganic antireflection layer.

13. The interconnection forming method of claim 12, wherein said hard mask is formed of a plasma SiON film.

14. An interconnection forming method claimed in claim 12 wherein the inorganic antireflection layer and the metal interconnection layer are continuously dry-etched by use of a gas including $Cl_2$ in the same chamber.

15. An interconnection forming method claimed in claim 14 wherein in the continuous dry-etching, the inorganic antireflection layer is dry-etched under a condition having a first ratio of $BCl_3$; and the metal interconnection layer is dry-etched under a condition having a second ratio of $BCl_3$, wherein said first ratio is greater than said second ratio.

16. An interconnection forming method claimed in claim 15 wherein if there is remaining plasma SiON of the inorganic antireflection layer, after an interlayer insulator film is formed, a via hole is formed by a via hole etching; and the remaining plasma SiON at the bottom of the via hole is removed by an organic removing liquid.

17. An interconnection forming method claimed in claim 14 wherein after the continuous dry-etching, an over-etching process is carried out by a dry-etching; and after an ashing treatment is carried out, a wet removing treatment is carried out by using an organic removing liquid including 0.1% to 3% of ammonium fluoride and 10% to 80% of water, so that an etching deposition which occurred during the continuous dry etching, is removed together with any remaining plasma SiON film.

18. An interconnection forming method claimed in claim 17 wherein before the etching deposition is removed by the organic removing liquid, a plasma $SiO_2$ film dry etching and an ashing using an $O_2/CF_4$ gas containing $CF_4$ wherein the amount of $CF_4$ is varied in the range of 0% to 10% of the amount of $O_2$, are carried out in order to make it easy to remove the remaining inorganic antireflection layer.

19. An interconnection forming method claimed in claim 18 wherein after the plasma SiON film of the inorganic antireflection layer and the hard mask are dry-etched, a resist is removed by the ashing; and the metal interconnection layer is dry-etched by using the hard mask.

20. An interconnection forming method claimed in claim 19 wherein just before the dry etching of the metal interconnection layer, the wet removing treatment using the organic removing liquid is carried out, so that the plasma SiON film of the inorganic antireflection layer and the etching deposition are removed; and the metal interconnection layer is dry-etched.

21. An interconnection forming method claimed in claim 17 wherein after the plasma SiON film of the inorganic antireflection layer and the hard mask are dry-etched, a resist is removed by the ashing; and the metal interconnection layer is dry-etched by using the hard mask.

22. An interconnection forming method claimed in claim 21 wherein just before the dry etching of the metal interconnection layer, the wet removing treatment using the organic removing liquid is carried out, so that the plasma SiON film of the inorganic antireflection layer and the etching deposition are removed; and the metal interconnection layer is dry-etched.

* * * * *